(12) United States Patent
Zhao

(10) Patent No.: US 11,069,756 B2
(45) Date of Patent: Jul. 20, 2021

(54) DISPLAY PANEL, DISPLAY DEVICE AND METHOD FOR DRIVING DISPLAY PANEL

(71) Applicant: BOE TECHNOLOGY GROUP CO., LTD., Beijing (CN)

(72) Inventor: Lijun Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 202 days.

(21) Appl. No.: 16/303,993

(22) PCT Filed: Apr. 12, 2018

(86) PCT No.: PCT/CN2018/082810
§ 371 (c)(1),
(2) Date: Nov. 21, 2018

(87) PCT Pub. No.: WO2018/192408
PCT Pub. Date: Oct. 25, 2018

(65) Prior Publication Data
US 2020/0321409 A1  Oct. 8, 2020

(30) Foreign Application Priority Data

Apr. 17, 2017 (CN) .......................... 201710249127.0

(51) Int. Cl.
*G02F 1/1343* (2006.01)
*G02F 1/1368* (2006.01)
(Continued)

(52) U.S. Cl.
CPC ........ *H01L 27/3232* (2013.01); *G02F 1/1368* (2013.01); *G02F 1/13439* (2013.01);
(Continued)

(58) Field of Classification Search
CPC ............... H01L 27/322; H01L 27/3244; H01L 27/3248; H01L 27/3225; H01L 27/3276;
(Continued)

(56) References Cited

U.S. PATENT DOCUMENTS 6,954,239 B2    10/2005  Kato et al.
2003/0052869 A1*  3/2003  Fujii ................... H01L 27/3232
                                                              345/204
(Continued)

FOREIGN PATENT DOCUMENTS

CN          1482585 A      3/2004
CN       101131495 A       2/2008
(Continued)

OTHER PUBLICATIONS

Office Action dated Apr. 19, 2019 issued in corresponding Chinese Application No. 201710249127.0.
(Continued)

*Primary Examiner* — Thoi V Duong
(74) *Attorney, Agent, or Firm* — Nath, Goldberg & Meyer; Joshua B. Goldberg

(57) ABSTRACT

The present application provides a display panel, a display device and a method for driving the display panel. The display panel includes a control unit layer, an organic light emitting device structure and a liquid crystal display device structure, wherein the control unit layer is electrically coupled to the organic light emitting device structure and the liquid crystal display device structure, respectively, and an electrode of the organic light emitting device structure and an electrode of the liquid crystal display device structure are at least partially shared.

17 Claims, 3 Drawing Sheets

(51) Int. Cl.
*H01L 27/32* (2006.01)
*G02F 1/1335* (2006.01)

(52) U.S. Cl.
CPC .. *G02F 1/133514* (2013.01); *G02F 1/133553* (2013.01); *G02F 1/134309* (2013.01); *H01L 27/322* (2013.01); *H01L 27/3211* (2013.01); *H01L 27/3276* (2013.01); *G02F 2201/121* (2013.01); *G02F 2201/123* (2013.01); *G02F 2201/44* (2013.01)

(58) Field of Classification Search
CPC ............ H01L 27/3218; H01L 27/3262; H01L 27/3258; H01L 27/3211; H01L 27/3232; H01L 51/5012; H01L 51/5203; H01L 51/5218; H01L 51/5271; H01L 51/5221; H01L 2251/5338; G02F 1/13; G02F 1/13306; G02F 1/1335; G02F 1/133617; G02F 1/1362; G02F 1/1368; G02F 1/133512; G02F 1/133514; G02F 1/1333; G02F 1/133553; G02F 1/134309; G02F 1/13439; G02F 1/136286; G02F 1/133345; G02F 1/1343; G02F 2201/121; G02F 2201/123; G02F 2201/44; G02F 2001/133614
See application file for complete search history.

(56) References Cited

U.S. PATENT DOCUMENTS

| | | |
|---|---|---|
| 2008/0050852 A1 | 2/2008 | Hwang et al. |
| 2008/0151144 A1 | 6/2008 | Hirose et al. |
| 2010/0302483 A1* | 12/2010 | Peng .................... G02F 1/1336 349/106 |
| 2013/0153940 A1 | 6/2013 | Suganuma et al. |

FOREIGN PATENT DOCUMENTS

| | | |
|---|---|---|
| CN | 201429935 Y | 3/2010 |
| CN | 201622819 U | 11/2010 |
| CN | 102969361 A | 3/2013 |
| CN | 106842731 A | 6/2017 |
| KR | 10-2008-0060146 A | 7/2008 |

OTHER PUBLICATIONS

International Search Report dated Jul. 9, 2018 issued in corresponding International Application No. PCT/CN2018/082810.

* cited by examiner

11,069,756 B2

DISPLAY PANEL, DISPLAY DEVICE AND METHOD FOR DRIVING DISPLAY PANEL

CROSS-REFERENCE TO RELATED APPLICATION

This is a National Phase Application filed under 35 U.S.C. 371 as a national stage of PCT/CN2018/082810, filed Apr. 12, 2018, an application claiming the benefit of Chinese Application No. 201710249127.0, filed Apr. 17, 2017, the contents of which is hereby incorporated herein in their entirety by reference.

TECHNICAL FIELD

The present disclosure relates to the field of display technology, and in particular, relates to a display panel, a display device and a method for driving a display panel.

BACKGROUND

With the development of the display technology, liquid crystal display (LCD) and organic light-emitting diode (OLED) display have become main stream of flat panel display so far. Light crystal display has advantages such as no radiation, low energy consumption, no visual deformation and so on, and organic light-emitting diode display has advantages such as self-luminous, fast response, wide angle of view and so on.

In order to lower power consumption, so far there has been proposed a scheme in which flexible bottom-emission type OLED and reflection type LCD are integrated by Out Cell method. Generally, a reflection electrode is separately fabricated and independently forms a layer. In such integrated structure, the reflection electrode occupies an opening region of a pixel, higher power consumption is required to achieve equal display brightness, and technical process is complex.

SUMMARY

In one aspect, the present application provides a display panel, including a control unit layer, an organic light emitting device structure and a liquid crystal display device structure, wherein the control unit layer is electrically coupled to the organic light emitting device structure and the liquid crystal display device structure, respectively, and an electrode of the organic light emitting device structure and an electrode of the liquid crystal display device structure are at least partially shared.

Optionally, the organic light emitting device structure at least includes an anode, a cathode and a light emitting layer between the anode and the cathode, and the liquid crystal display device structure at least includes a pixel electrode, a common electrode, a liquid crystal layer and a color filter layer; the cathode of the organic light emitting device structure also serves as the pixel electrode or the common electrode of the liquid crystal display device structure.

Optionally, the anode, the light emitting layer, and the cathode of the organic light emitting device structure are disposed sequentially in a vertical direction, the cathode serves as the pixel electrode, and the liquid crystal layer, the common electrode and the color filter layer of the liquid crystal display device structure are disposed sequentially at a side of the cathode distal to the light emitting layer along a direction away from the cathode.

Optionally, the display panel further includes a passivation layer disposed between the organic light emitting device structure and the liquid crystal display device structure, and the passivation layer is disposed between the cathode and the liquid crystal layer.

Optionally, the pixel electrode is made of a reflective conductive material.

Optionally, the display panel is divided into a plurality of pixel regions, the light emitting layer of the organic light emitting device structure is configured to emit white light, and the color filter layer includes a plurality of color filter blocks, each of which is disposed in corresponding one of the plurality of pixel regions and is spread all over the pixel region.

Optionally, the cathode serves as the common electrode, the pixel electrode, the cathode, the liquid crystal layer, and the color filter layer are disposed sequentially in a vertical direction, and the light emitting layer and the anode of the organic light emitting device structure are disposed sequentially at a side of the cathode distal to the liquid crystal layer along a direction away from the cathode.

Optionally, the anode includes a plurality of anode blocks, the pixel electrode includes a plurality of pixel electrode blocks, and the plurality of anode blocks and the plurality of pixel electrode blocks are disposed alternately in one layer and electrically insulated from each other.

Optionally, the display panel is divided into a plurality of pixel regions, the light emitting layer of the organic light emitting device structure includes a plurality of light emitting blocks configured to emit light of at least two colors, and each of the plurality of light emitting blocks is disposed in a portion n of a corresponding one of the pixel regions, and the color filter layer of the liquid crystal display device structure includes a plurality of color filter blocks, each of which is disposed in corresponding one of the pixel regions and is disposed in a different layer from the light emitting block in the pixel region, and has a same color as the light emitting block in the pixel region.

Optionally, in each of the pixel regions, an orthographic projection of the color filter block on the liquid crystal layer and an orthographic projection of the light emitting block on the liquid crystal layer substantially do not overlap with each other.

Optionally, the common electrode is made of a transparent conductive material.

Optionally, the display panel further includes gate lines and data lines intersecting with one another, the control unit layer includes a plurality of first thin film transistors (TFTs) and a plurality of second TFTs provided in a same layer, and each of the first TFTs corresponds to one of the second TFTs, a gate of each of the first TFTs and a gate of the corresponding one of the second TFTs are coupled to corresponding one of the gate lines, a source of each of the first TFTs and a source of the corresponding one of the second TFTs are coupled to different ones of the data lines, a drain of the first TFT is coupled to the anode, and a drain of the second TFT is coupled to the pixel electrode.

Optionally, the display panel is divided into a plurality of pixel regions, each of which has one pixel structure provided therein, adjacent ones of the pixel regions have pixel structures of three primary colors capable of emitting white light, respectively, wherein the pixel structures of three primary colors constitute a pixel unit.

In another aspect, the present disclosure provides a display device, including the display panel described above.

In another aspect, the present disclosure provides a method for driving a display panel, the display panel including a control unit layer, an organic light emitting device structure and a liquid crystal display device structure, wherein the control unit layer is electrically coupled to the organic light emitting device structure and the liquid crystal display device structure, respectively, and a cathode of the organic light emitting device structure and a pixel electrode of the liquid crystal display device structure are shared, the method including: determining if an ambient light intensity is greater than a threshold; in a case where it is determined that the ambient light intensity is not greater than the threshold, driving, by the control unit layer, the organic light emitting device structure to emit light and the liquid crystal display device structure not to emit light; in a case where it is determined that the ambient light intensity is greater than the threshold, driving, by the control unit layer, the liquid crystal display device structure to emit light and the organic light emitting device structure not to emit light.

DETAILED DESCRIPTION

In order that one skilled in the art can better understand technical solutions of the present disclosure, the display panel according to the present disclosure is described below in further detail in conjunction with accompanying drawings and specific implementations.

In the context, the term "opening region" refers to a region in a pixel structure through which light can be transmitted, and the pixel structure herein may refer to a sub-pixel. The term "provided in a same layer" refers to "provided by a same patterning process using a same mask, and/or provided at a substantially same horizontal height". The term "share" means that one physical component plays functions of two functional components. For example, one electrode may play functions of both a cathode of an OLED and a pixel electrode of a LCD.

Figure 1:
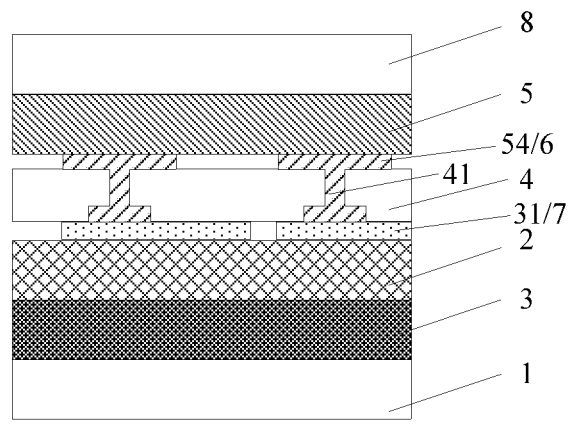
FIG. 1 is a schematic diagram of a structure of a conventional display panel in which a liquid crystal display and an organic light emitting device are integrated by Out Cell method.

FIG. 1 is a cross-sectional view of a part of an existing display panel in which a bottom-emission type white light OLED and a reflection type LCD are integrated. Referring to FIG. 1, in this display panel, a liquid crystal display device structure 5 is directly fabricated above an organic light emitting device structure 3, spaced by a passivation layer (PVCS) 4 provided therebetween. In this structure, a reflection electrode 6 and a transmission electrode 7 of the organic light emitting device structure are fabricated above a control unit layer 2 including a thin film transistor; meanwhile, a passivation layer through hole 41 is provided in the passivation layer 4, so that one control circuit set can realize control of the transflective structure. Material filling in the passivation layer through hole 41 is downwardly coupled to the transmission electrode 7 located at the opening region, to apply a voltage to the organic light emitting device structure 3 causing it to emit light, and is upwardly coupled to the reflection electrode 6 located at the opening region, to apply a voltage to the liquid crystal display device structure 5 to orient liquid crystal. In such an integrated structure, since the reflection electrode 6 needs to occupy an opening region of a pixel (that is, occupy an area of the light-transmissive region of the pixel), a pixel aperture ratio is reduced and brightness is lowered as a result. Thus, to reach an equal display brightness, it is required to increase a driving voltage, resulting in increase in power consumption and complexity of technical process.

For this, the present disclosure provides, inter alia, a display panel, which at least partially addresses problems in the related art of high power consumption, complex technical process, low pixel aperture ratio, and low brightness when a liquid crystal display and an organic light emitting device display are integrated.

An embodiment of the present disclosure provides a display panel, which integrates a reflection type LCD display module by In Cell method while having an OLED display module. That is, by integrating the LCD display module within the OLED cell, one display panel can include not only the OLED display module but also the reflection type LCD display module, and the display panel has more simple and compact structure while having simplified process procedure, the aperture ratio of the display panel is improved, thereby obtaining a display device having low power consumption and high image quality.

Figure 2:
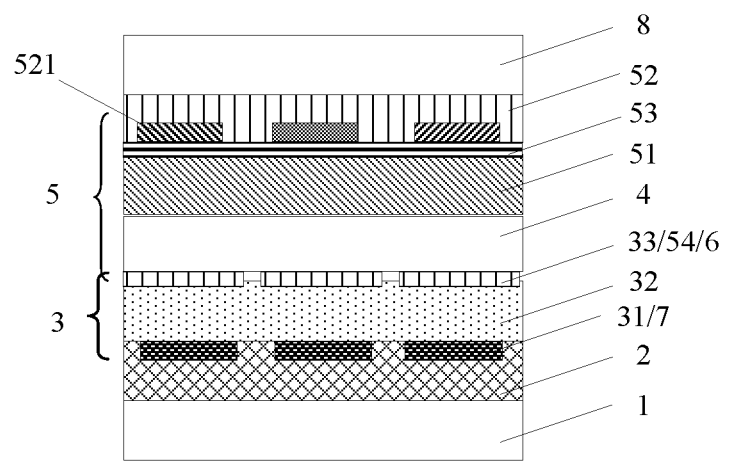
FIG. 2 is a schematic diagram of a structure of a display panel according to an embodiment of the present disclosure.

In some embodiments, the display panel includes a plurality of pixel regions defined by gate lines and data lines intersecting with one another. As shown in FIG. 2, the display panel includes a control unit layer 2, an organic light emitting device structure 3 and a liquid crystal display device structure 5 sequentially stacked upwardly. The control unit layer 2 is electrically coupled to the organic light emitting device structure 3 and the liquid crystal display device structure 5, respectively, such that this display panel can automatically select one of the organic light emitting device structure 3 and the liquid crystal display device structure 5 to perform display according to different environment light intensity. In one embodiment, each pixel of the display panel is provided with a pixel structure, which includes a part of the control unit layer 2, a part of the organic light emitting device structure 3 and a part of the liquid crystal display device structure 5. For example, the control unit layer 2 includes a plurality of control units such as thin film transistors, the organic light emitting device structure 3 includes a plurality of organic light emitting devices, and the liquid crystal display device structure 5 includes a plurality of liquid crystal display devices, and each pixel structure at least includes one control unit, one organic light emitting device and one liquid crystal display device. An electrode of the organic light emitting device structure 3 and an electrode of the liquid crystal display device structure 5 are shared at least in part. In some embodiments, a cathode 33 of the organic light emitting device structure 3 is also serves as a pixel electrode 54 of the liquid crystal display device structure 5, and the pixel electrode 54 also serves as an optical reflection electrode 6 at the same time to increase display brightness of the pixel structure. The display panel shares layer structures of different display modules, which simplifies the structure of the display panel and realizes high aperture ratio and high brightness.

In some embodiments, the organic light emitting device structure 3 at least includes an anode 31, a cathode 33 and a light emitting layer 32 between the anode 31 and the cathode 33. The liquid crystal display device structure 5 at least includes a color filter layer 52, an array substrate (i.e., a layer structure of the control unit layer 2 including a thin film transistor), a pixel electrode 54, a common electrode 53 and a liquid crystal layer 51 between the pixel electrode 54 and the common electrode 53. In an embodiment of the present disclosure, since the cathode 33 of the organic light emitting device structure 3 further at least serves as the pixel electrode 54 of the liquid crystal display device structure 5, that is, further serves as the reflection electrode 6, display brightness of the pixel structure is effectively increased while simplifying the fabrication process. The display panel forms a dual-mode display through the above shared structure of OLED and LCD, and greatly improves display brightness by reflective means to effectively increase brightness.

In FIG. 2, a first substrate 1 and a second substrate 8 serve as a support for the display panel, the anode 31, the light emitting layer 32, and the cathode 33 are disposed sequentially in a vertical direction (for example, from bottom to top in FIG. 2) in the organic light emitting device structure 3, the pixel electrode 54, the liquid crystal layer 51, the common electrode 53 and the color filter layer 52 are disposed sequentially in the vertical direction (for example, from bottom to top in FIG. 2) in the liquid crystal display device structure 5, and the cathode 33 of the organic light emitting device structure 3 and the pixel electrode 54 of the liquid crystal display device structure 5 are shared. In other words, the liquid crystal layer 51, the common electrode 53 and the color filter layer 52 of the liquid crystal display device structure 5 are disposed sequentially at a side of the cathode 33, which also serves as the pixel electrode 54, distal to the light emitting layer 32 along a direction pointing away from the cathode 33. The passivation layer 4 (PVX) is disposed between the organic light emitting device structure 3 and the liquid crystal display device structure 5, the cathode 33 is disposed above the light emitting layer 32 and below the passivation layer 4, and the cathode 33 and the pixel electrode 54 are shared.

As for a reflection type liquid crystal display device structure 5, the pixel electrode 54 therein is formed of a conductive material having a reflective property, to serve as the optical reflection electrode 6 at the same time. In FIG. 2, the pixel electrode 54 and the cathode 33 are shared, from which it can be seen that, compared to the integrated structure of the display panel in FIG. 1, opening process of the passivation layer 4 and fabrication process of the reflection electrode 6 are omitted, the passivation layer 4 can effectively protect light emitting material in the OLED, preventing water vapor and oxygen from entering; and aperture ratio of the display panel is improved and brightness is increased.

In the display panel according to an embodiment of the present disclosure, the organic light emitting device structure 3 is a white light device, that is, the light emitting layer 32 of the organic light emitting device structure 3 emits white light; the color filter layer includes a plurality of color filter blocks 521, each of which is disposed in corresponding one of the pixel regions and is spread all over the pixel region. In this structure of display panel where the white light OLED is matched with LCD, since the entire pixel region is effective display region, the aperture ratio is maximum, close to 100%.

The control unit layer 2 includes a plurality of first thin film transistors (TFTs) and a plurality of second TFTs provided in a same layer, and each of the first TFTs corresponds to one of the second TFTs. A gate of each of the first TFTs and a gate of the corresponding one of the second TFTs are coupled to corresponding one of gate lines, a source of each of the first TFTs and a source of the corresponding one of the second TFTs are coupled to different data lines, a drain of the first TFT is coupled to the anode 31 of the organic light emitting device structure 3, and a drain of the second TFT is coupled to the pixel electrode 54 of the liquid crystal display device structure 5. Display control of a pixel region under different environments is realized by the first TFT and the second TFT.

In some embodiments, the working principle of the display panel is as follows. First, an ambient light intensity is determined, if the ambient light intensity is high, then a grayscale signal for display is applied to the cathode 33, i.e. pixel electrode 54, to control the LCD display to perform display; an anode signal of the OLED display is matched with the cathode signal to cause the OLED display not to emit light. When the ambient light intensity is low, a direct-current signal is applied to the cathode 33, i.e. pixel electrode 54, and a common electrode signal of the LCD display is matched with the direct-current signal to cause the LCD display not to perform display a grayscale signal for display is applied to the anode 31 of the OLED display to cause the OLED display to perform display normally.

In some embodiments, different display modes can be employed under different environments using external ambient light. For example, in a case where the OLED display performs display and the ambient light intensity is relatively high, display brightness can be improved by utilizing reflection of the ambient light by the reflection electrode, which, compared to top-transmission mode only employing OLED display, can utilize self-emission of the OLED display more effectively, and can reduce power consumption.

It is readily understood that, by colorization effect of the color filter blocks 521, pixel structures of three primary colors (for example, including red, green and blue subpixels) capable of forming white light may be provided in multiple adjacent pixel regions, respectively, and the pixel structures of three primary colors form a pixel unit. By forming a pixel unit by the pixel structures of three primary colors, good display effect can be ensured.

In the display panel of an embodiment of the present disclosure, by the integration and electrode sharing of a top-emission type white light OLED and a reflection type LCD, two processes, namely, a passivation layer throughhole forming process and a process for separately fabricating a reflection electrode, are omitted, so that the structure of the display panel is more compact, and the aperture ratio can be improved effectively, obtaining a display device with low power consumption and high image quality.

Figure 3:
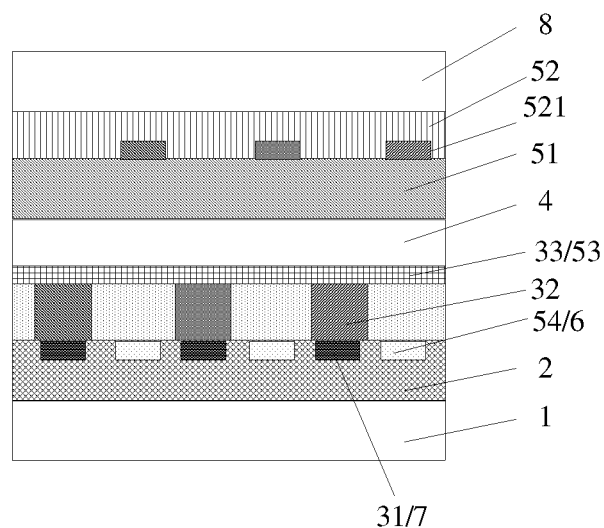
FIG. 3 is a schematic diagram of a structure of a display panel according to an embodiment of the present disclosure.
Figure 4:
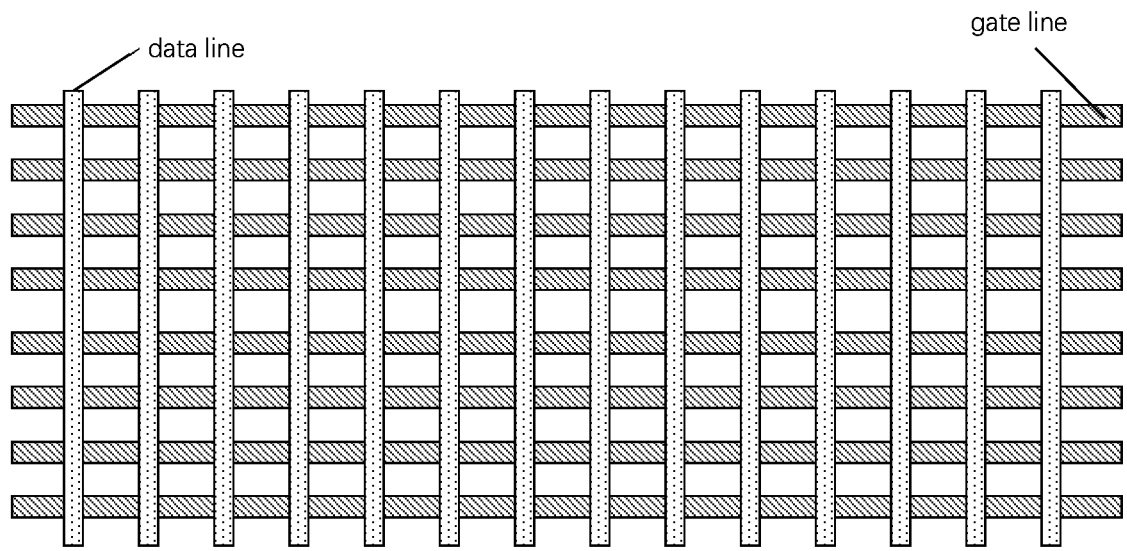
FIG. 4 is a schematic diagram illustrating gate lines and data lines of the display panel according to an embodiment of the present disclosure.
Figure 5:
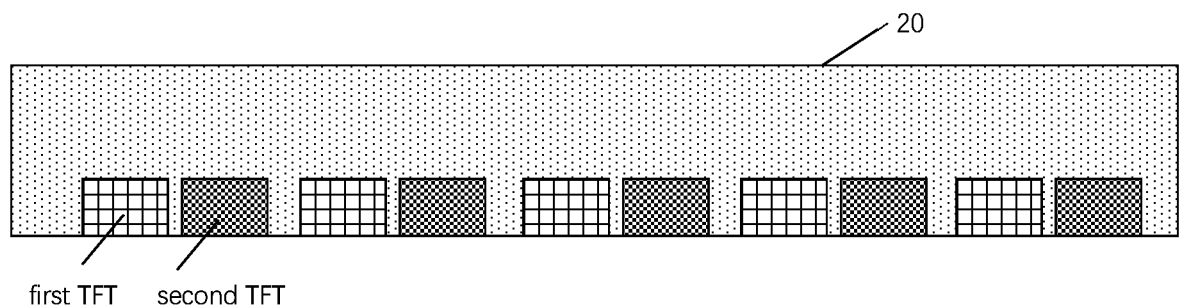
FIG. 5 is a schematic diagram illustrating a control unit layer of the display panel according to an embodiment of the present disclosure.
Figure 6:
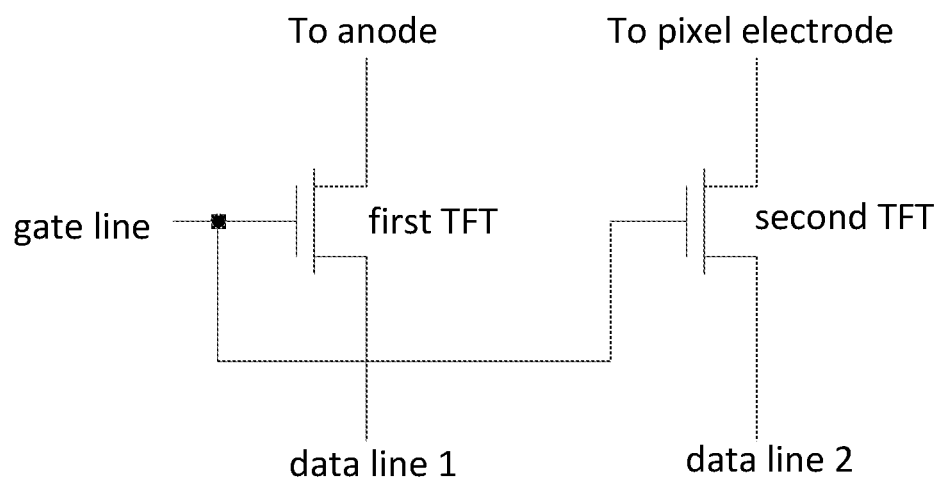
FIG. 6 is a schematic diagram illustrating an electric connection of first and second thin film transistors according to an embodiment of the present disclosure.

FIG. 3 illustrates a cross-sectional view of a part of a display panel according to an embodiment of the present disclosure. The display panel shown in FIG. 3 differs from the display panel shown in FIG. 2 mainly in that, the cathode 33 of the organic light emitting device structure also serves as the common electrode 53 of the liquid crystal display device structure, and the organic light emitting device is a colored light emitting device.

In some embodiments, the display panel includes a plurality of pixel regions defined by gate lines and data lines intersecting with one another. As shown in FIG. 3, the display panel includes a control unit layer 2, an organic light emitting device structure and a liquid crystal display device structure. The control unit layer 2 is electrically coupled to the organic light emitting device structure and the liquid crystal display device structure, respectively, such that this display panel can automatically select one of the organic light emitting device structure and the liquid crystal display device structure to perform display according to different ambient light intensity. An electrode of the organic light emitting device structure and an electrode of the liquid crystal display device structure are at least partially shared.

In some embodiments, the organic light emitting device structure at least includes an anode 31, a cathode 33 and a light emitting layer 32 between the anode 31 and the cathode 33, and the liquid crystal display device structure at least includes a color filter layer 52, an array substrate (i.e., a layer structure of the control unit layer 2 including a thin film transistor), a pixel electrode 54, a common electrode 53 and a liquid crystal layer 51. Referring to FIG. 3, the cathode 33 of the organic light emitting device structure of the display panel further serves as the common electrode 53 of the liquid crystal display device structure, and the pixel electrode 54 further serves as an optical reflection electrode 6. The display panel shares layer structures of different display modules, which simplifies the structure of the display panel and increases the aperture ratio, so that display brightness of the pixel structure can be effectively increased while simplifying the fabrication process. The display panel forms a dual-mode display through the above shared structures of OLED and LCD, and greatly improves display brightness by reflective means to effectively increase brightness.

In FIG. 3, the anode 31, the light emitting layer 32, and the cathode 33 are disposed sequentially in a vertical direction (for example, from bottom to top in FIG. 3) in the organic light emitting device structure, the pixel electrode 54, the common electrode 53, the liquid crystal layer 51, and the color filter layer 52 are disposed sequentially in the vertical direction (for example, from bottom to top in FIG. 3) in the liquid crystal display device structure, and the cathode 33 and the common electrode 53 are shared. In other words, the light emitting layer 32 and the anode 31 of the organic light emitting device structure are disposed sequentially at a side of the cathode 33 distal to the liquid crystal layer 51 along a direction pointing away from the cathode 33. A passivation layer 4 is disposed between the liquid crystal layer 51 and the common electrode 53/cathode 33. In some embodiments, the anode 31 includes a plurality of anode blocks, the pixel electrode 54 includes a plurality of pixel electrode blocks, and the plurality of anode blocks and the plurality of pixel electrode blocks are alternately disposed in one layer above the control unit layer 2 including the thin film transistor, and below the light emitting layer 32. The common electrode 53 and the cathode 33 are shared and disposed above the light emitting layer 32.

In some embodiments, the light emitting layer 32 of the organic light emitting device structure of the display panel emits colored light, and light of different colors in the colored light are naturally mixed to form white light as viewed by human eyes. For example, the light emitting layer 32 of the organic light emitting device structure includes a plurality of light emitting blocks, which emit light of at least two colors, and each of the light emitting blocks is disposed in a portion of a corresponding one of pixel regions. The color filter layer of the liquid crystal display device structure includes a plurality of color filter blocks 521, each of which is disposed in corresponding one of the pixel regions and is disposed in a different layer from the light emitting block in the pixel region, and has the same color as the light emitting block in the pixel region. An area of the color filter block 521 and an area of the light emitting block of the organic light emitting device structure are complementary to each other within the pixel region, and together fill the entire pixel region. In other words, an orthographic projection of the color filter block 521 on the liquid crystal layer 51 and an orthographic projection of the light emitting block on the liquid crystal layer 51 substantially do not overlap with each other. This matching structure of the OLED display device and the LCD display device (i.e. double colorization layer structure) improves colorization and brightness and maintains a relatively large aperture ratio.

In FIG. 3, the anode 31 of the OLED display device is the transmission electrode 7, the pixel electrode 54 is the reflection electrode 6, and the cathode 33 also serves as the common electrode 53. Each of the pixel regions may include one anode block and one pixel electrode block adjacent to each other, and the anode block and the pixel electrode block are disposed apart from each other within the pixel region, that is, the pixel electrode 54 and the anode 31 are not electrically coupled, so as to ensure that driving voltages are supplied separately to the LCD display device and the OLED display device; moreover, the pixel electrode 54 is correspondingly disposed under a region of each pixel region where the color light emitting block is not disposed (in other words, in one pixel region, a projection of the light emitting block and a projection of the pixel electrode do not overlap with each other), improved display and brightness of the entire pixel region is achieved by the pixel electrode 54, i.e. reflection electrode 6.

As for a reflection type liquid crystal display device structure, its pixel electrode 54 is formed of a conductive material having a reflective property to serve as the optical reflection electrode 6 at the same time. The common electrode 53 is formed of a transparent conductive material to satisfy transmission effect.

In some embodiments, the working principle of the display panel is as follows. The cathode 33 of the OLED display device structure and the common electrode 53 of the LCD display device structure are shared, and the anode 31 and the pixel electrode 54 are disposed spaced apart from each other. Thus, when a direct-current signal is applied to the cathode 33/common electrode 53, a signal applied to the anode of the OLED display device structure and a signal applied to the pixel electrode 54 of the LCD display device structure may be simultaneously matched to cause both the OLED display device and the LCD display device to perform normal display.

In this display panel, when the ambient light intensity is high, display brightness is improved by utilizing reflection of the ambient light by the reflection electrode, and power consumption is reduced; meanwhile, with the design in which the pixel electrode 54 is the reflection electrode 6, pixel ratio is increased, which, compared to top-transmission mode only employing OLED display, can utilize self-emission of the OLED display more effectively, and can reduce power consumption.

In the display panel of an embodiment of the present disclosure, by the combination of top-emission type full-color OLED and the reflection type LCD, and sharing of the cathode and the common electrode, a display device with low power consumption and high image quality is obtained.

In another aspect, the present disclosure provides a display device, including the above display panel. The display device of an embodiment of the present disclosure may be any product or component having a display function such as an electronic paper, a mobile phone, a tablet PC, a television, a laptop computer, a digital photo frame, a navigator or the like.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A display panel, comprising a control unit layer, an organic light emitting device structure and a liquid crystal display device structure, wherein the control unit layer is electrically coupled to the organic light emitting device structure and the liquid crystal display device structure, respectively, and an electrode of the organic light emitting device structure and an electrode of the liquid crystal display device structure are at least partially shared, wherein the organic light emitting device structure at least comprises an anode, a cathode and a light emitting layer between the anode and the cathode, and the liquid crystal display device structure at least comprises a pixel electrode, a common electrode, a liquid crystal layer and a color filter layer; and the cathode of the organic light emitting device structure also serves as the pixel electrode or the common electrode of the liquid crystal display device structure, wherein the anode, the light emitting layer, and the cathode of the organic light emitting device structure are disposed sequentially in a vertical direction, the cathode serves as the pixel electrode, and the liquid crystal layer, the common electrode and the color filter layer of the liquid crystal display device structure are disposed sequentially at a side of the cathode distal to the light emitting layer along a direction pointing away from the cathode, and wherein the pixel electrode is made of a reflective conductive material.

2. The display panel according to claim 1, further comprising a passivation layer disposed between the organic light emitting device structure and the liquid crystal display device structure, wherein the passivation layer is disposed between the cathode and the liquid crystal layer.

3. The display panel according to claim 2, further comprising gate lines and data lines intersecting with one another, the control unit layer comprises a plurality of first thin film transistors (TFTs) and a plurality of second TFTs provided in a same layer, and each of the first TFTs corresponds to one of the second TFTs, a gate of each of the first TFTs and a gate of the corresponding one of the second TFTs are coupled to corresponding one of the gate lines, a source of each of the first TFTs and a source of the corresponding one of the second TFTs are coupled to different ones of the data lines, a drain of the first TFT is coupled to the anode, and a drain of the second TFT is coupled to the pixel electrode.

4. The display panel according to claim 1, wherein the display panel is divided into a plurality of pixel regions, the light emitting layer of the organic light emitting device structure is configured to emit white light, and the color filter layer comprises a plurality of color filter blocks, each of which is disposed in corresponding one of the plurality of pixel regions and is spread all over the pixel region.

5. The display panel according to claim 4, further comprising gate lines and data lines intersecting with one another, the control unit layer comprises a plurality of first thin film transistors (TFTs) and a plurality of second TFTs provided in a same layer, and each of the first TFTs corresponds to one of the second TFTs, a gate of each of the first TFTs and a gate of the corresponding one of the second TFTs are coupled to corresponding one of the gate lines, a source of each of the first TFTs and a source of the corresponding one of the second TFTs are coupled to different ones of the data lines, a drain of the first TFT is coupled to the anode, and a drain of the second TFT is coupled to the pixel electrode.

6. The display panel according to claim 1, wherein the display panel is divided into a plurality of pixel regions, each of which has one pixel structure provided therein, pixel structures of three primary colors capable of emitting white light are provided in adjacent pixel regions, respectively, the pixel structures of three primary colors constituting a pixel unit.

7. The display panel according to claim 1, further comprising gate lines and data lines intersecting with one another, the control unit layer comprises a plurality of first thin film transistors (TFTs) and a plurality of second TFTs provided in a same layer, and each of the first TFTs corresponds to one of the second TFTs, a gate of each of the first TFTs and a gate of the corresponding one of the second TFTs are coupled to corresponding one of the gate lines, a source of each of the first TFTs and a source of the corresponding one of the second TFTs are coupled to different ones of the data lines, a drain of the first TFT is coupled to the anode, and a drain of the second TFT is coupled to the pixel electrode.

8. A display device, comprising the display panel according to claim 1.

9. A method for driving a display panel, the display panel being the display panel of claim 1, the method comprising:
determining if an ambient light intensity is greater than a threshold;
in a case where it is determined that the ambient light intensity is not greater than the threshold, driving, by the control unit layer, the organic light emitting device structure to emit light, and the liquid crystal display device structure not to emit light;
in a case where it is determined that the ambient light intensity is greater than the threshold, driving, by the control unit layer, the liquid crystal display device structure to emit light, and the organic light emitting device structure not to emit light.

10. A display panel, comprising a control unit layer, an organic light emitting device structure and a liquid crystal display device structure, wherein the control unit layer is electrically coupled to the organic light emitting device structure and the liquid crystal display device structure, respectively, and an electrode of the organic light emitting device structure and an electrode of the liquid crystal display device structure are at least partially shared, wherein the organic light emitting device structure at least comprises an anode, a cathode and a light emitting layer between the anode and the cathode, and the liquid crystal display device structure at least comprises a pixel electrode, a common electrode, a liquid crystal layer and a color filter layer; and the cathode of the organic light emitting device structure also serves as the pixel electrode or the common electrode of the liquid crystal display device structure, wherein the cathode serves as the common electrode, the pixel electrode, the cathode, the liquid crystal layer, and the color filter layer are disposed sequentially in a vertical direction, and the light emitting layer and the anode of the organic light emitting device structure are disposed sequentially at a side of the cathode distal to the liquid crystal layer along a direction pointing away from the cathode.

11. The display panel according to claim 10, wherein the anode comprises a plurality of anode blocks, the pixel electrode comprises a plurality of pixel electrode blocks, and the plurality of anode blocks and the plurality of pixel electrode blocks are disposed alternately in one layer and electrically insulated from each other.

12. The display panel according to claim 11, further comprising gate lines and data lines intersecting with one another, the control unit layer comprises a plurality of first thin film transistors (TFTs) and a plurality of second TFTs provided in a same layer, and each of the first TFTs corresponds to one of the second TFTs, a gate of each of the first TFTs and a gate of the corresponding one of the second TFTs are coupled to corresponding one of the gate lines, a source of each of the first TFTs and a source of the corresponding one of the second TFTs are coupled to different ones of the data lines, a drain of the first TFT is coupled to the anode, and a drain of the second TFT is coupled to the pixel electrode.

13. The display panel according to claim 10, wherein the display panel is divided into a plurality of pixel regions, the light emitting layer of the organic light emitting device structure comprises a plurality of light emitting blocks configured to emit light of at least two colors, and each of the light emitting blocks is disposed in a portion of a corresponding one of the plurality of pixel regions, and the color filter layer of the liquid crystal display device structure comprises a plurality of color filter blocks, each of which is disposed in corresponding one of the plurality of pixel regions and is disposed in a different layer from, but has a same color as, the light emitting block in the pixel region.

14. The display panel according to claim 13, wherein in each of the plurality of pixel regions, an orthographic projection of the color filter block on the liquid crystal layer and an orthographic projection of the light emitting block in the pixel region on the liquid crystal layer substantially do not overlap with each other.

15. The display panel according to claim 14, further comprising gate lines and data lines intersecting with one another, the control unit layer comprises a plurality of first thin film transistors (TFTs) and a plurality of second TFTs provided in a same layer, and each of the first TFTs corresponds to one of the second TFTs, a gate of each of the first TFTs and a gate of the corresponding one of the second TFTs are coupled to corresponding one of the gate lines, a source of each of the first TFTs and a source of the corresponding one of the second TFTs are coupled to different ones of the data lines, a drain of the first TFT is coupled to the anode, and a drain of the second TFT is coupled to the pixel electrode.

16. The display panel according to claim 10, wherein the common electrode is made of a transparent conductive material.

17. A display panel, comprising a control unit layer, an organic light emitting device structure and a liquid crystal display device structure, wherein the control unit layer is electrically coupled to the organic light emitting device structure and the liquid crystal display device structure, respectively, and an electrode of the organic light emitting device structure and an electrode of the liquid crystal display device structure are at least partially shared, wherein the organic light emitting device structure at least comprises an anode, a cathode and a light emitting layer between the anode and the cathode, and the liquid crystal display device structure at least comprises a pixel electrode, a common electrode, a liquid crystal layer and a color filter layer; and the cathode of the organic light emitting deice structure also serves as the pixel electrode or the common electrode of the liquid crystal display device structure, and the display panel further comprises gate lines and data lines intersecting with one another, the control unit layer comprises a plurality of first thin film transistors (TFTs) and a plurality of second TFTs provided in a same layer, and each of the first TFTs corresponds to one of the second TFTs, a gate of each of the first TFTs and a gate of the corresponding one of the second TFTs are coupled to corresponding one of the gate lines, a source of each of the first TFTs and a source of the corresponding one of the second TFTs are coupled to different ones of the data lines, a drain of the first TFT is coupled to the anode, and a drain of the second TFT is coupled to the pixel electrode.

* * * * *